United States Patent
Ali et al.

(10) Patent No.: US 6,465,733 B1
(45) Date of Patent: *Oct. 15, 2002

(54) ELECTRONIC PACKAGE STRUCTURE UTILIZING ALUMINUM NITRIDE/ALUMINUM COMPOSITE MATERIAL

(75) Inventors: M. Akbar Ali, Lomita, CA (US); Carl W. Peterson, Carson, CA (US); Hutan Taghavi, Hermosa Beach, CA (US); Bruce W. Buller, Diamond Bar, CA (US)

(73) Assignee: Hughes Electronics Corp., Los Angeles, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/902,465

(22) Filed: Jul. 29, 1997

Related U.S. Application Data

(62) Division of application No. 08/360,493, filed on Dec. 21, 1994, now Pat. No. 5,688,450.

(51) Int. Cl.[7] ............................................... H01L 23/02
(52) U.S. Cl. ...................... 174/52.4; 257/703; 257/704; 257/705
(58) Field of Search .............................. 174/52.2, 52.3, 174/52.4; 257/678, 684, 702, 703, 704, 705

(56) References Cited

U.S. PATENT DOCUMENTS

| | | | | |
|---|---|---|---|---|
| 4,743,299 A | * | 5/1988 | Pryor et al. | 75/235 |
| 5,043,535 A | * | 8/1991 | Lin | 174/52.4 |
| 5,365,108 A | * | 11/1994 | Anderson et al. | 257/678 |

* cited by examiner

*Primary Examiner*—Hung V. Ngo

(57) ABSTRACT

A packaged electronic structure includes an electronic device, and a package to which the electronic device is affixed. At least a portion of the package is made of a composite material of aluminum nitride dispersed in aluminum. The composite material is preferably prepared by mixing powders of the aluminum nitride and aluminum, and thereafter pressing and sintering the mixture.

19 Claims, 3 Drawing Sheets

ELECTRONIC PACKAGE STRUCTURE UTILIZING ALUMINUM NITRIDE/ ALUMINUM COMPOSITE MATERIAL

This is a division of application Ser. No. 08/360,493 filed Dec. 21, 1994, now U.S. Pat. No. 5,688,450.

BACKGROUND OF THE INVENTION

This invention relates to a packaged electronic structure, and, more particularly, to such a structure wherein the packaging of an electronic device is made of aluminum nitride/aluminum composite material.

Microelectronic devices are used in a wide variety of applications. Such devices typically include a generally planar piece (commonly termed a "chip") of a material such as silicon, upon which circuit elements are mounted. The circuit elements can include both passive elements such as resistors or capacitors, and active elements such as transistors or sensors. Many types of microelectronic devices can be prepared using existing fabrication technology. The microelectronic device has the advantages of small size and light weight.

The chip and its circuit elements, considered alone, have some disadvantages. They are rather fragile and sensitive to environmental degradation. Attachment of external leads can be difficult due to the small size. The chip and its circuit elements can also generate a great deal of heat in a small area, leading to overheating of the device. Most of the available types of circuit elements are particularly sensitive to overheating.

In an effort to overcome these disadvantages, support and packaging structures have been developed. The chip may be attached to a stronger substrate made of a material such as aluminum oxide, which becomes a part of the electronic device. The electronic device may also be fixed to, and protected by, a package structure. A common type of package structure includes a base to which the substrate or chip of the electronic device is fixed and a physically and thermally compatible lid which attaches over the base and affixed electronic device. Such a package can be hermetically sealed to prevent environmental damage to the electronic device, but can also provide feedthroughs for external leads to reach to the electronic device. In other cases, only a base is used.

The package must be designed so that its presence does not adversely affect the operation of the microelectronic device. Most commonly, this requirement means that the thermal expansion coefficient of the package base must be comparable with that of the portion of the electronic device that is affixed to it. If the thermal expansion coefficients are markedly different, temperature changes during service of the electronic device can lead to thermally induced stresses in the fragile chip and to the damage of the electronic device.

The package used for some applications, particularly those involving high-power electronic devices, should also have at least moderate thermal conductivity. If the package is too good an insulator, the heat produced within the package cannot be dissipated. Excessive temperature increases are the result. Lastly, the packaging desirably should be made of a relatively light weight material, as any excess weight partially negates the size and weight advantages otherwise inherent in microelectronic devices.

At the present time, metals such as molybdenum, tungsten, invar, and kovar are used as the housing or packaging materials. Nonmetals such as aluminum oxide are used as the substrate materials. None of the packaging materials has an optimal combination of properties for use with silicon chip devices. Invar and kovar have acceptable coefficients of thermal expansion, but have high densities and low thermal conductivities. Molybdenum has a high coefficient of thermal expansion and high density, but acceptable thermal conductivity. Tungsten has an acceptable coefficient of thermal expansion and thermal conductivity, but is very dense. Aluminum oxide has an acceptable density and coefficient of thermal expansion, but very low thermal conductivity.

There is a need for an improved packaging material for use with electronic devices. The packaging material should have the combination of desirable properties that make it suitable for use with common types of electronic chip devices. The present invention fulfills this need, and further provides related advantages.

SUMMARY OF THE INVENTION

The present invention provides a packaged electronic structure in which the package can be manufactured so that its coefficient of thermal expansion is matched to that of the electronic device. The material of construction of the package combines the features of metals and non-metals into a single composite material, and has the most desirable thermal, mechanical, and electrical properties of such a material for use in the packaging application. The package is readily formed from its material of construction and is stable in long-term service.

In accordance with the invention, a packaged electronic structure comprises an electronic device, and a package to which the electronic device is affixed. At least a portion of the package comprises a composite material made of aluminum nitride dispersed in aluminum.

The package is preferably prepared from aluminum nitride and aluminum powders by sintering, most preferably by hot isostatic pressing. Selected amounts of the powders are mixed together and cold pressed to form a "green compact". The green compact is placed into a mold. A hot isostatic pressing medium is placed around the green compact. The assembly is heated to elevated temperature, preferably just above the melting point of the aluminum powder, and isostatically compacted to a final, dense or nearly fully dense, structure. The composite material may be compacted to the required final shape, or it may be compacted to a semi-finished shape and then machined or formed to the final shape.

Aluminum and aluminum nitride both have relatively low densities, so that the weight of the final package is low. The coefficient of thermal expansion of the package can be selected by adjusting the relative proportions of the aluminum nitride powder and the aluminum powder. The more aluminum nitride powder that is used in the mixture and thence is present in the final package, the lower the coefficient of thermal expansion. The coefficient of thermal expansion of the package can thereby be selected to match that of the microelectronic device chip or substrate, or have a slightly different value if desired. The thermal conductivity of the composite material is high, as both aluminum and aluminum nitride have high thermal conductivities. The weight and thermal conductivity of the composite also vary somewhat with the proportions of the powders used, but that variation is relatively small and is acceptable for all proportions of interest.

The packaged electronic structure of the invention provides an important advance in the art. The weight, thermal conductivity, stability, and fabricability of the package are all excellent. Additionally, the thermal expansion coefficient of the package can be tailored to provide a desired relationship to that of the packaged electronic device. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
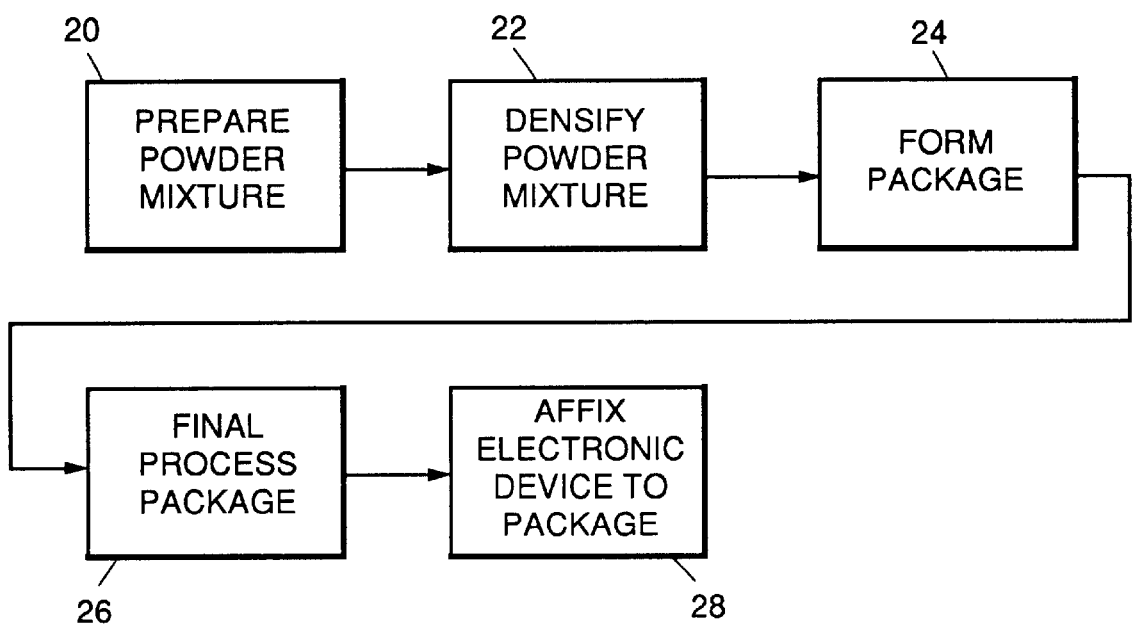
FIG. 1 is a block diagram flow chart for the method of making the packaged electronic structure.

FIG. 1 depicts a preferred approach for preparing the electronic package structure of the invention. At least a portion of the package, typically at least the base, is made of a composite material of aluminum nitride dispersed in aluminum. In a composite material, the aluminum nitride and aluminum retain their bulk physical forms, and in this respect a composite material is distinct from an alloy. That is, the aluminum nitride is not dissolved into the aluminum. Instead, the aluminum nitride is present as small particles that are dispersed throughout an aluminum matrix.

A mixture of aluminum nitride and aluminum powders is furnished, numeral 20. Aluminum nitride (AlN) and aluminum (Al) were selected because of the uniquely useful properties for electronic packaging that can be obtained in a composite of these materials and the ability to fabricate a useful composite material. The aluminum nitride has a low density of 3.26 grams per cubic centimeter, a relatively low coefficient of thermal expansion of 4.5 parts per million per degree C., and, for a nonmetallic material, a relatively high thermal conductivity of 250 watts per meter-degree K. Aluminum has a low density of 2.70 grams per cubic centimeter and a high thermal conductivity of 222 watts per meter-degree C. The composite material made from a mixture of aluminum nitride and aluminum has properties intermediate these values, depending upon the relative proportions of the constituents. Aluminum has a high coefficient of thermal expansion of about 23 parts per million per degree C. The composite of aluminum nitride and aluminum has a lower coefficient of thermal expansion that can be tailored for each specific application of the packaging material. Aluminum nitride and aluminum also do not chemically react with each other to any appreciable degree at the applicable processing and service temperatures. Such reactions, that are observed in some other materials combinations such as silicon carbide and aluminum, can lead to mechanical degradation of the composite material and are undesirable. Moreover, no binders are required in the processing.

Aluminum nitride is a nonmetallic material that is available commercially in powder form of various powder size ranges. In a reduction to practice of the present invention, generally equiaxed KT grade aluminum nitride powder was obtained from Hermann C. Starck, Inc. Two different size ranges of aluminum powder were obtained, a coarse powder having a size range of −140+240 mesh and a fine powder having a size range of −400 mesh. In the art, powder sizes are commonly expressed in terms of the mesh size. The designation "−140" means that the powder passes through a screen having a sieve mesh opening size of 0.0041 inches, "+240" means that the powder will not pass, through a screen having a sieve mesh opening size of 0.0025 inches, and "−400" means that the powder passes through a screen having a sieve mesh opening size of 0.0015 inches.

In the preferred approach, two different sizes of aluminum nitride powder are used together in the manufacture of the composite so that a high packing density can be achieved in those composites having a high fraction of sintered aluminum nitride powder. For the sake of uniformity, in studies reported subsequently the aluminum nitride powder included 72 percent by weight of the coarse aluminum nitride powder and 28 percent by weight of the fine aluminum powder. The use of two size ranges and these indicated fractions is preferred, not required.

The aluminum powder used in the mixture can be substantially pure aluminum, termed "1100 aluminum" in the art, or an aluminum alloy of aluminum intentionally mixed with at least one other element. Both substantially pure aluminum and aluminum alloys such as 6061 and 6063 aluminum have been used in reductions to practice of the invention. As used herein, the term "aluminum", when used to describe either the powder or the aluminum matrix of the composite material, includes both substantially pure aluminum and aluminum alloys. The aluminum is furnished as a powder to facilitate mixing with the aluminum nitride powder. Preferably, the aluminum powder is −325 mesh powder that can be obtained from many commercial suppliers such as Herman C. Starck, Inc., and Don Chemical U.S.A.

The relative proportions of the aluminum nitride powder and the aluminum powder that are mixed together can be selected to attain specific properties in the final composite material. The property that is selectively controlled in most cases is the coefficient of thermal expansion. The amount of aluminum nitride can vary from just above zero to just below 100 percent of the mixture, with aluminum the balance of the mixture. However, the composites with relatively small amounts of aluminum nitride have coefficients of thermal expansion that are, below about 40 weight percent aluminum nitride in the composite, too large to be of practice interest, inasmuch as they are near to that of aluminum and much greater than that of typical chip and substrate materials. The composites with relatively large amounts of aluminum nitride, more than about 95 weight percent aluminum nitride in the composite, cannot be readily fabricated because they are nearly entirely aluminum nitride with no aluminum to bind the aluminum nitride particles together. A preferred range of from about 40 to about 95 weight percent aluminum nitride (of the total of aluminum nitride and aluminum) has therefore been identified. Within this range, the exact amount of aluminum nitride is chosen to achieve specific properties in the final composite material, as will be discussed.

The aluminum nitride particles and the aluminum particles are weighed and mixed together. The mixture is preferably mixed into a liquid carrier that can later be removed, such as methyl alcohol, to form a thin slurry and mixed in an ultrasonic mixer for about 10 minutes. The carrier is thereafter removed, as by evaporation, and the mixture is dried. This mixing procedure is used to obtain a uniform mixture, and other operable procedures can be used.

The mixture is next densified, numeral 22. A two-stage densification processing is used in the preferred approach. In the first stage, the mixture of aluminum nitride and aluminum powders is pressed together at ambient temperature with a pressure sufficient to form a freestanding compact, termed a "green compact". A compaction pressure of from about 10,000–40,000 pounds per square inch is operable. No binders or other additives are required to produce a compact that adheres together, because the aluminum deforms sufficiently to achieve adherence of the compacted mass. The resulting green compacts are sufficiently strong to be handled in the remaining processing steps.

The green compact of aluminum nitride and aluminum powders is coated with a release material. In the preferred approach, a suspension of commercial grade -325 mesh boron nitride powder in methyl alcohol was prepared and sprayed over the outside surface of the green compact to a thickness of 0.010–0.015 inch and permitted to dry. The release material allows the final composite material to be separated from its hot isostatic pressing medium in the preferred processing.

The coated, green compact is sintered, preferably by liquid phase sintering achieved by hot isostatic pressing. In this sintering, that portion of the aluminum powder which is mixed with the aluminum nitride powder melts and flows around the aluminum nitride powder. Upon cooling, the composite material of aluminum nitride particles embedded in an aluminum matrix results.

Figure 2:
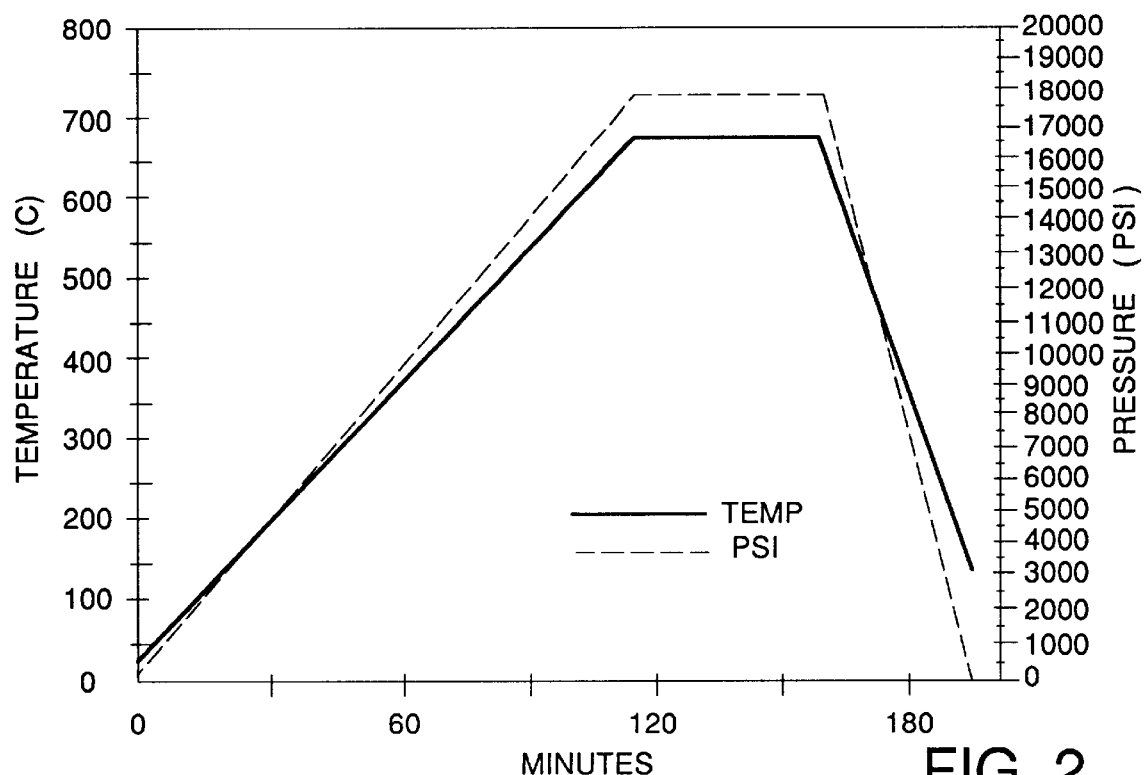
FIG. 2 is a graph of temperature as a function of time during hot isostatic pressing of the composite material.

To accomplish the hot isostatic pressing, the bottom of a graphite container was covered with a layer of 1100 aluminum powder. The coated green compact was placed into the graphite container over the bed of aluminum powder, and more 1100 aluminum powder was added to cover the coated green compact. This added aluminum powder acts as a hot isostatic pressing medium. The graphite container, and the coated, green compact and aluminum powder therein, were placed into a hot isostatic pressing furnace and heated to about 660° C. in a pressure of argon gas. FIG. 2 depicts the temperature and pressure profiles in the preferred processing. At 660° C., the aluminum powder added to the graphite container but not part of the green compact melts and surrounds the compact, acting as a pressure transfer medium. The aluminum powder within the compact also melts and surrounds the aluminum nitride particles completely. The boron nitride layer prevents the aluminum outside of the compact from mixing into the aluminum inside the compact, and permits the final composite to be separated from the aluminum hot isostatic pressing medium after the assembly is cooled.

The shape and size of the package are formed, numeral 24. In one approach, the densification step 22 is used to make slabs or blocks of the composite material, and the components of the package are machined or formed from the slabs or blocks. In another approach, the steps 22 and 24 are performed concurrently but using a compression die having a shape approximating that of the final package part. Only a final touchup machining would then be required. If a feedthrough is present in the package, it can be drilled into the package and completed in a conventional manner.

The package is optionally final processed, numeral 26. In the preferred case, the package is plated with a thin layer of gold to inhibit environmental damage to the package and to aid in making electrical connections to the electronic device supported on the package. At this point of the processing, the package structure itself is complete.

In its preferred application, an electronic device is affixed to the package, usually to the inside of the base, numeral 28. The affixing is accomplished by any operable approach, such as an adhesive, ultrasonic welding, brazing, or the like, as is appropriate for joining the electronic device to the aluminum nitride/aluminum composite material of the package. Leads are connected as necessary. If a lid is used, it is placed over the base and joined to the base using any operable approach.

Figure 4:
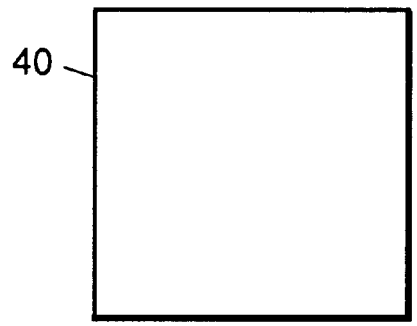
FIG. 4 is a plan view of a hot isostatically pressed package.
Figure 5:
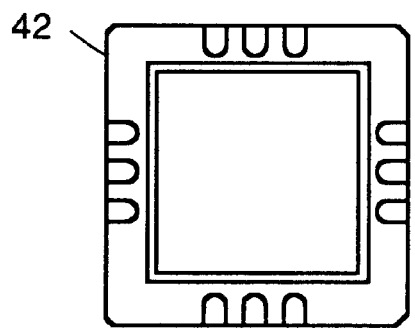
FIG. 5 is a machined package structure.
Figure 6:
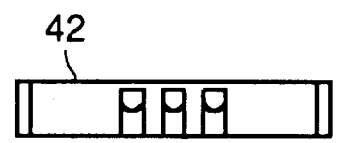
FIG. 6 is an elevational view of the machined package of FIG. 5.
Figure 7:
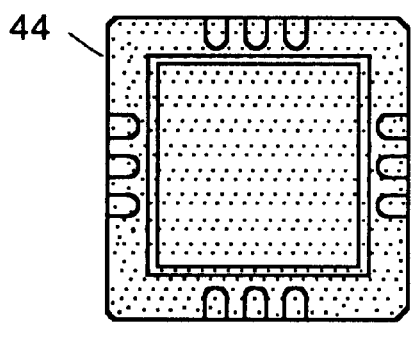
FIG. 7 is a plan view of a gold-plated package structure.
Figure 8:
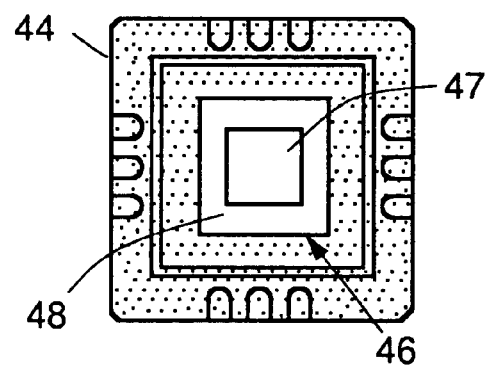
FIG. 8 is a plan view of the gold-plated package of FIG. 7, with an electronic device attached.

FIGS. 4–8 illustrate a preferred form of the electronic package at various stages of fabrication. FIG. 4 depicts a densified plate 40, prepared by hot isostatic pressing, at the conclusion of the densification step 22. FIGS. 5 and 6 depict a machined plate 42 after the plate 40 has been machined in package forming step 24. FIG. 7 shows a gold-plated package 44, after plating the machined plate 42 with gold in step 26. The package itself is complete at this point. An electronic device 46 is attached to the package 44 in the affixing step 28, as shown in FIG. 8. The electronic device 46 includes a chip 47 attached to a substrate 48. The substrate 48 is affixed to the gold-plated package base 44.

The following examples are presented to illustrate aspects of the invention, and should not be taken as limiting the invention in any respect.

EXAMPLE 1

A set of composite materials, having different proportions of sintered aluminum nitride and aluminum, were successfully fabricated according to the approach described herein. The following proportions were used, where the proportion of aluminum nitride is expressed as a weight percent of the total of aluminum nitride and aluminum, and the balance of the composite was 1100 aluminum: 95 percent, 92 percent, 85 percent, 80 percent, 75 percent, 60 percent, 55 percent, 50 percent, 45 percent, and 40 percent aluminum nitride.

Figure 3:
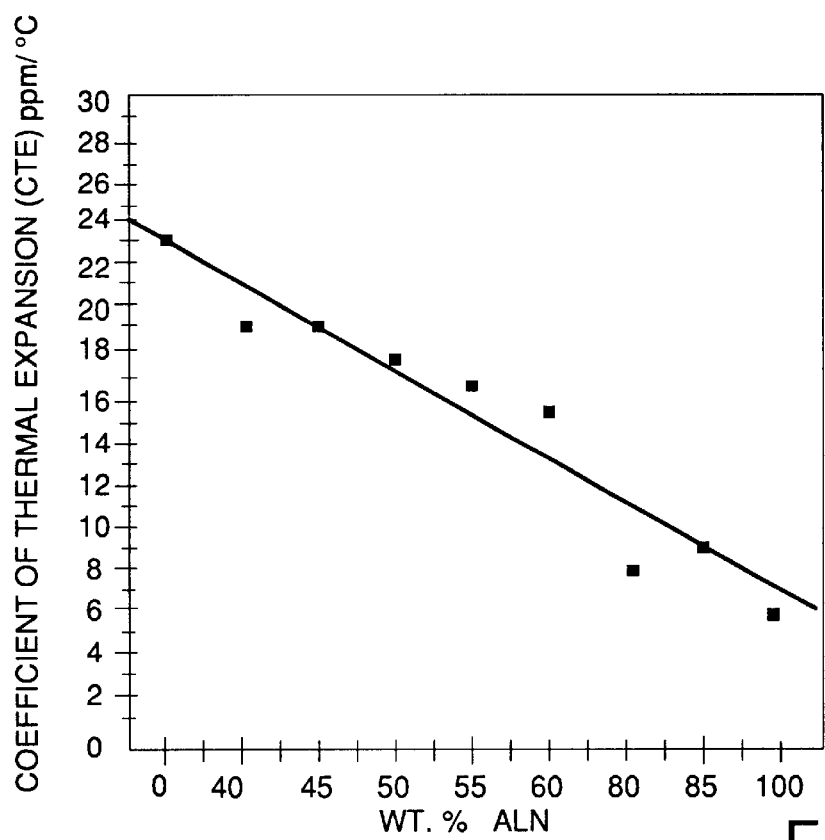
FIG. 3 is a graph of the measured coefficient of thermal expansion of the composite material as a function of the amount of aluminum nitride that is present in the composite.

The coefficients of thermal expansion of the composites were measured, and FIG. 3 presents the results as a function of the percent of aluminum nitride (AlN) present in the composite material. The measured coefficients of thermal expansion range from a high of about 19 parts per million per degree C. for a composite having about 40 weight percent aluminum nitride to a low of about 5 parts per million per degree C. for a composite having about 95 weight percent aluminum nitride. Thus, the coefficient of thermal expansion of the composite package can be tailored to any required value over this range using this graph to select the weight percentage of aluminide nitride in the composite material. The densities and thermal conductivities of the composite material also vary as the proportions of the constituents change, but not so extensively and in a manner that is fully acceptable in all cases.

One particular composite package material of interest, as shown in FIG. 3, is the material having about 80 weight percent aluminum nitride and 20 weight percent aluminum. This material has a coefficient of thermal expansion of about 6.7 parts per million per degree C., substantially the same as that of 96 percent purity aluminum oxide that is often used as the substrate of electronic devices. Thus, a package fabricated with this proportion of the constituents would expand and contract at the same rate as an aluminum oxide substrate, so that there would be no thermal stresses and strains induced in the microelectronic device, as a result of the packaging.

EXAMPLES 2 AND 3

Example 1 was repeated, except that the aluminum powder was 6061 aluminum (Example 2) or 6063 aluminum (Example 3). Packages were successfully prepared using these aluminum alloys.

Figure 9:
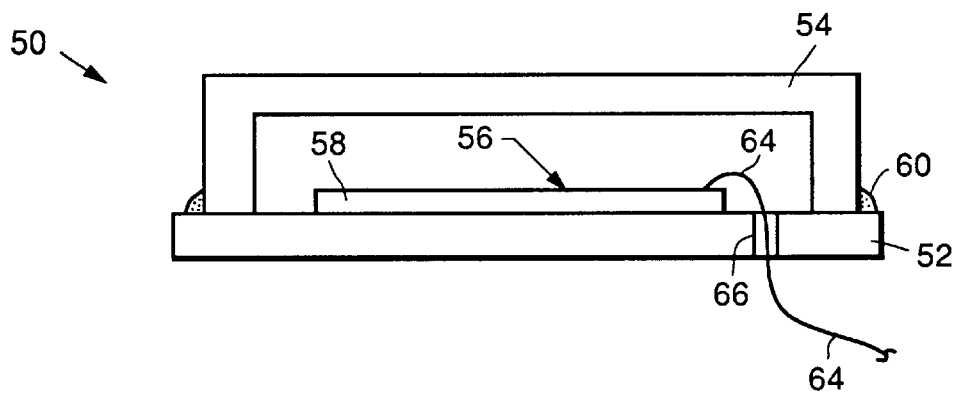
FIG. 9 is a sectional view of another embodiment of the package with an attached device.

The preceding discussion and the examples have been directed toward a preferred embodiment of the invention in which there is no package lid. FIG. 9 depicts a further embodiment of a package 50 having a package base 52 like that described previously, but additionally having a package lid 54. An electronic device 56, including a chip and its circuitry 58, is affixed to the package base 52. In this case, the chip 58, and any associated circuitry that is fabricated in or attached to the chip 58, is mounted directly to the package base 52. The chip 58 is not mounted to a substrate, which is in turn mounted to the package base 52. This configuration is contrasted with that of FIG. 8, where there is a substrate to which the chip is affixed, and it is the substrate that is attached to the base. In the embodiment of FIG. 9, the properties of the aluminum nitride/aluminum composite material of the package base 52 are selectively tailored to match directly with those of the chip 58, and no substrate is required.

The package lid 54 fits over the electronic device 56 and attaches to the base 52. The base 52 and lid 54 together form an enclosure of the electronic device 56, so that, in combination, the base 52 and lid 54 protect the electronic device 56 from physical damage and environmental attack. The lid 54, when used, may be attached to the base 52 with a bead 60 of a material such as a metal to seal the lid to the base. Fasteners may also be used. Leads 64 can pass from the chip and circuitry 58 through feedthroughs 66 in the package base 52 to exterior connections. The embodiments of FIGS. 8 and 9 are intended to illustrate various possible embodiments, including packaged electronic devices with and without substrates, and with and without lids. The various approaches can be used in other combinations and in conjunction with other features.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A packaged electronic structure, comprising:
   an electronic device; and
   a package to which the electronic device is affixed, at least a portion of the package comprising a composite material made of from about 40 to about 95 volume percent of generally equiaxed aluminum nitride particles, having a particle size in the range −140 mesh, dispersed throughout and embedded in an aluminum matrix, with no binders present.

2. The packaged electronic structure of claim 1, wherein the package comprises a base.

3. The packaged electronic structure of claim 1, wherein the package comprises a lid.

4. The packaged electronic structure of claim 1, wherein the. aluminum is an alloy of aluminum and at least one other element.

5. The packaged electronic structure of claim 1, wherein the electronic device comprises a chip attached to an aluminum oxide substrate, and wherein the composite material comprises about 80 volume percent of the aluminum nitride particles.

6. The packaged electronic structure of claim 1, wherein the aluminum is substantially pure aluminum.

7. A packaged electronic structure, comprising:
   an electronic device; and
   a package to which the electronic device is affixed, at least a portion of the package comprising a composite material made of aluminum nitride particles dispersed throughout and embedded in an aluminum matrix, the aluminum nitride particles including first particles having a first size range and second particles having a second size range smaller than the first size range.

8. The packaged electronic structure of claim 7, wherein the package comprises a base.

9. The packaged electronic structure of claim 7, wherein the package comprises a lid.

10. The packaged electronic structure of claim 7, wherein the aluminum nitride is in the form of generally equiaxed particles.

11. The packaged electronic structure of claim 7, wherein the first size range is −140+240 mesh, and the second size range is −400 mesh.

12. The packaged electronic structure of claim 7, wherein the aluminum is substantially pure aluminum.

13. The packaged electronic structure of claim 7, wherein the aluminum is an alloy of aluminum and at least one other element.

14. The packaged electronic structure of claim 7, wherein the electronic device comprises
   an aluminum oxide substrate affixed to the portion of the package comprising the composite material, and
   a chip attached to the aluminum oxide substrate, and
   wherein the portion of the package comprising the composite material has about 80 volume percent aluminum nitride.

15. The packaged electronic structure of claim 7, wherein the composite material comprises from about 40 to about 95 volume percent aluminum nitride.

16. A packaged electronic structure, comprising:
   an electronic device, comprising
      an aluminum oxide substrate, and
      a chip attached to the aluminum oxide substrate; and
   a package to which the aluminum oxide substrate of the electronic device is affixed, the portion of the package to which the aluminum oxide substrate is affixed being a composite material made of from about 40 to about 95 volume percent of aluminum nitride particles dispersed throughout and embedded in an aluminum matrix, with no binders present.

17. The packaged electronic structure of claim 16, wherein the aluminum nitride particles are generally equiaxed.

18. The packaged electronic structure of claim 16, wherein the aluminum nitride particles have a particle size in the range −140 mesh.

19. The packaged electronic structure of claim 16, wherein the composite material comprises about 80 volume percent aluminum nitride.

* * * * *